(12) United States Patent
Shue et al.

(10) Patent No.: US 6,197,701 B1
(45) Date of Patent: Mar. 6, 2001

(54) LIGHTLY NITRIDATION SURFACE FOR PREPARING THIN-GATE OXIDES

(75) Inventors: Shau-Lin Shue, Hsinchu; Jih-Churng Twu, Chung-ho, both of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/177,191

(22) Filed: Oct. 23, 1998

(51) Int. Cl.[7] ..................................................... H01L 21/31
(52) U.S. Cl. ........................... 438/763; 438/791; 438/792
(58) Field of Search ..................................... 438/763, 791, 438/792

(56) References Cited

U.S. PATENT DOCUMENTS

| | | | |
|---|---|---|---|
| 4,214,919 | 7/1980 | Young | 148/1.5 |
| 4,254,161 | * 3/1981 | Kemlage . | |
| 5,264,724 | * 11/1993 | Brown et al. . | |
| 5,407,870 | * 4/1995 | Okada et al . | |
| 5,445,999 | * 8/1995 | Thakur et al. . | |
| 5,464,792 | 11/1995 | Tseng et al. | 437/160 |
| 5,596,218 | 1/1997 | Soleimani et al. | 257/369 |
| 5,795,833 | * 8/1998 | Yu et al. . | |
| 5,851,603 | * 12/1998 | Tsai et al. . | |
| 5,904,523 | * 5/1999 | Feldman et al. . | |
| 5,907,792 | * 5/1999 | Droopad et al. . | |

OTHER PUBLICATIONS

C.T. Liu et al. "Preventing Boran Penetration Through 25-A Gate Oxides With Nitrogen Implant in the Si Substrates", IEEE Electron Device Letters, vol. 16, (No. 5), May, 1997, pp. 212–14.

* cited by examiner

Primary Examiner—John F. Niebling
Assistant Examiner—Josetta Jones
(74) Attorney, Agent, or Firm—George O. Saile; Stephen B. Ackerman; Stephen G. Stanton

(57) ABSTRACT

A method for forming a dielectric layer upon a silicon layer. There is first provided a substrate employed within a microelectronics fabrication. There is then formed over the substrate a silicon layer. There is then formed through use of a first plasma annealing method employing a nitrogen containing plasma annealing atmosphere a silicon nitride containing layer upon a partially consumed silicon layer derived from the silicon layer. There is then oxidized through use of a second thermal annealing method employing an oxidizing material containing atmosphere the silicon nitride containing layer to form an oxidized silicon nitride containing layer upon a further consumed silicon layer derived from the partially consumed silicon layer. The method is particularly useful for forming gate dielectric layers within field effect transistors (FETs).

13 Claims, 2 Drawing Sheets

LIGHTLY NITRIDATION SURFACE FOR PREPARING THIN-GATE OXIDES

BACKGROUND OF THE INVENTION

1. Field of the Invention

The present invention relates generally to dielectric layers employed within microelectronics fabrications. More particularly, the present invention relates to methods for fabricating dielectric layers with improved properties within microelectronics fabrications.

2. Description of the Related Art

Integrated circuit microelectronics fabrications are formed from semiconductor substrates within and upon whose surfaces are formed resistors, transistors, diodes and other electrical circuit elements. The electrical circuit elements are connected internally and externally to a semiconductor substrate upon which they are formed through patterned conductor layers which are separated by dielectric layers.

As integrated circuit integration levels have increased and integrated circuit device and conductor element dimensions have decreased, various novel effects have evolved within integrated circuit devices which are fabricated within integrated circuit microelectronics fabrications. Within integrated circuit microelectronics fabrications within which are formed field effect transistors (FETs), a general group of detrimental effects arising incident to decreased field effect transistor (FET) dimensions within advanced integrated circuit microelectronics fabrications is known as short channel effects (SCEs). Within the general group of effects known as short channel effects (SCEs), a particularly common effect is the hot carrier effect (HCE). The hot carrier effect (HCE) derives from increased electrical fields within semiconductor substrates adjoining gate electrode edges within advanced field effect transistors (FETs). The increased electrical fields lead to increased charge carrier injection into the gate dielectric layers of the field effect transistors (FETs), which in turn leads to degradation of field effect transistor (FET) operating parameters such as but not limited to threshold voltage and drive current.

Beyond the hot carrier effect (HCE) which derives from both decreased gate dielectric layer thickness within a field effect transistor (FET) and decreased channel width within the field effect transistor (FET), there also exists within advanced field effect transistors (FETs) inherently decreased dopant diffusion barrier properties of comparatively thin gate dielectric layers with respect to dopants which are employed when doping polysilicon or polycide gate electrode layers within advanced field effect transistor (FETs). Such decreased dopant diffusion barrier properties are typically manifested with respect to mobile dopants, such as boron containing dopants, and they contribute to undesired doping of field effect transistor (FET) channel regions. Undesired doping of field effect transistor (FET) channel regions also compromises operating parameters of field effect transistors (FETs) within advanced integrated circuit microelectronics fabrications.

It is thus desirable in the art of integrated circuit microelectronics fabrication to provide methods and materials through which field effect transistors (FETs) may be fabricated with attenuated susceptibility to hot carrier effects (HCEs) and with enhanced dopant diffusion barrier properties of their gate dielectric layers. It is towards those goals that the present invention is more specifically directed. In a more general sense, the present invention is also directed towards forming within microelectronics fabrications including but not limited to integrated circuit microelectronics fabrications dielectric layers with enhanced properties, such as but not limited to dopant diffusion barrier properties.

Various methods have been disclosed in the art of integrated circuit microelectronics fabrication for fabricating dielectric layers with desirable properties within integrated circuit microelectronics fabrications.

For example, Young, in U.S. Pat. No. 4,214,919, discloses a method for forming for use within an integrated circuit microelectronics fabrication a thin silicon oxide dielectric layer free of a nitrogen pre-thermal oxidation environment induced micro-defects, such as shorts, which compromise performance of the integrated circuit microelectronics fabrication within which is formed the thin silicon oxide dielectric layer. The method employs in place of the nitrogen pre-thermal oxidation environment a pre-thermal oxidation environment employing at least in part argon when forming the thin silicon oxide dielectric layer.

In addition, Okada et al., in U.S. Pat. No. 5,407,870, discloses a method for forming a high reliability dielectric layer which may be employed within an integrated circuit microelectronics device such as but not limited to a field effect transistor (FET) or a capacitor. The high reliability dielectric layer employs a composite of a pair of silicon oxynitride dielectric layers separated by a silicon oxide dielectric layer.

Further Thakur et al., in U.S. Pat. No. 5,445,999, discloses a method for forming a uniform silicon nitride layer upon a monocrystalline silicon substrate layer or a polycrystalline silicon substrate layer within an integrated circuit microelectronics fabrication. The method employs a treatment of the monocrystalline silicon substrate layer or the polycrystalline silicon substrate layer with a reactive gas composition comprising at least one of argon-hydrogen, hydrogen, germane and nitrogen trifluoride diluted with argon-hydrogen, at a temperature of from about 850 to about 1150 degrees centigrade, to form a uniform dangling bond configuration upon the monocrystalline silicon substrate layer or polycrystalline silicon substrate layer prior to forming thereupon a silicon nitride layer through a rapid thermal nitridation method.

Yet further, Tseng et al., in U.S. Pat. No. 5,464,792, which is related to and co-assigned with U.S. Pat. No. 5,407,870, discloses a method for incorporating nitrogen at an interface of a dielectric layer opposite the interface of the dielectric layer with a semiconductor substrate employed within an integrated circuit microelectronics fabrication. The method employs a silicon buffer layer, such as an amorphous silicon buffer layer or a polycrystalline silicon buffer layer, formed upon the dielectric layer, where upon forming upon the buffer layer an oxynitride layer and annealing the resulting integrated circuit microelectronics fabrication, nitrogen migrates to at least the interface of the buffer layer with the dielectric layer and possibly also to the interface of the dielectric layer with the silicon substrate.

Still yet further, Soleimani et al., in U.S. Pat. No. 5,596,218, discloses a method for forming a hot carrier resistant gate dielectric layer employed within a field effect transistor (FET) formed upon a semiconductor substrate within an integrated circuit microelectronics fabrication. The method employs implanting nitrogen ions into the semiconductor substrate and subsequently thermally oxidizing the semiconductor substrate to provide a gate dielectric layer having a peak nitrogen concentration near the gate dielectric layer interface with the semiconductor substrate.

Finally, Liu et al., in "Preventing Boron Penetration Through 25-A Gate Oxides With Nitrogen Implant in the Si Substrates," IEEE Electron Device Lett., Vol. 16 (No. 5), May 1997, pp 212–14, similarly with Soleimani, in U.S. Pat. No. 5,596,218, also discloses an ion implant method for forming a hot carrier resistant and mobile dopant diffusion resistant gate dielectric layer for use within a field effect transistor (FET) within an integrated circuit microelectronics fabrication. Somewhat in contrast with the Soleimani, the gate dielectric layer so formed has a peak nitrogen content within the gate dielectric layer rather than at the interface of the gate dielectric layer with the silicon substrate.

Desirable in the art of microelectronics fabrication are additional methods and materials through which there may be formed within microelectronics fabrications dielectric layers with enhanced properties. More particularly desirable within the art of integrated circuit microelectronics fabrications are methods and materials through which gate dielectric layers employed within field effect transistors (FETs) within integrated circuit microelectronics fabrications may be fabricated with enhanced properties such as but not limited to enhanced hot carrier resistance properties and enhanced mobile dopant diffusion resistance properties. It is towards the foregoing goals that the present invention is directed.

SUMMARY OF THE INVENTION

A first object of the present invention is to provide a method for forming within a microelectronics fabrication a dielectric layer.

A second object of the present invention is to provide a method in accord with the first object of the present invention, where the dielectric layer is a gate dielectric layer employed within a field effect transistor (FET) within an integrated circuit microelectronics fabrication.

A third object of the present invention is to provide a method in accord with the second object of the present invention, where the gate dielectric layer is formed with enhanced hot carrier resistance properties and enhanced mobile dopant diffusion barrier properties.

A fourth object of the present invention is to provide a method in accord with the first object of the present invention, the second object of the present invention or the third object of the present invention, which method is readily commercially implemented.

In accord with the objects of the present invention, there is provided by the present invention a method for forming a dielectric layer upon a silicon layer. To practice the method of the present invention, there is first provided a substrate employed within a microelectronics fabrication. There is then formed over the substrate a silicon layer. There is then formed through use of a first plasma annealing method employing a nitrogen containing plasma annealing atmosphere a silicon nitride containing layer upon a partially consumed silicon layer derived from the silicon layer. There is then oxidized through use of a second thermal annealing method employing an oxidizing material containing annealing atmosphere the silicon nitride containing layer to form an oxidized silicon nitride containing layer formed upon a further consumed silicon layer derived from the partially consumed silicon layer.

The present invention provides a method for forming within a microelectronics fabrication a dielectric layer. The present invention realizes the foregoing object by forming through partial consumption of a silicon layer through a first plasma annealing method employing a nitrogen containing plasma annealing atmosphere a silicon nitride containing layer and then oxidizing through further consumption of the partially consumed silicon layer through a second thermal annealing method employing an oxidizing material containing annealing atmosphere the silicon nitride containing layer to form an oxidized silicon nitride containing layer which forms a dielectric layer.

The method of the present invention may be employed where the dielectric layer is a gate dielectric layer within a field effect transistor (FET) within an integrated circuit microelectronics fabrication. The present invention does not discriminate with respect to the nature of a dielectric layer which is formed through the method of the present invention given that the dielectric layer is formed upon a silicon substrate layer within a microelectronics fabrication. Thus, the present invention may be employed where the dielectric layer is a gate dielectric layer which may be employed within a field effect transistor (FET) within an integrated circuit microelectronics fabrication, as well as other dielectric layers formed upon other silicon layers within other integrated circuit devices such as but not limited to capacitor dielectric layers within silicon layer capacitors within microelectronics fabrications including but not limited to integrated circuit microelectronics fabrications, solar cell microelectronics fabrications, ceramic substrate microelectronics fabrications and flat panel display microelectronics fabrications.

When employed for forming a gate dielectric layer within a field effect transistor (FET) within an integrated circuit microelectronics fabrication, a gate dielectric layer formed in accord with the method of the present invention is formed with enhanced hot carrier resistance properties and enhanced mobile dopant diffusion barrier properties. In addition, when employed for forming dielectric layers including but not limited to gate dielectric layers within field effect transistors (FETs), the method of the present invention also generally provides dielectric layers with attenuated oxidation rates and enhanced dielectric layer uniformity.

The method of the present invention is readily commercially implemented. The method of the present invention provides that a silicon layer within an integrated circuit microelectronics fabrication is plasma annealed through a first plasma annealing method within a nitrogen containing plasma annealing atmosphere to form a silicon nitride containing layer which is subsequently oxidized through a second thermal annealing method employing an oxidizing material containing annealing atmosphere to form an oxidized silicon nitride containing layer. Since plasma annealing methods and thermal annealing methods are generally known in the art of microelectronics fabrication, as are various materials which may be employed within those plasma annealing methods and thermal annealing methods, the method of the present invention is readily commercially implemented.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention provides a method for forming within a microelectronics fabrication a dielectric layer upon a silicon layer. The method of the present invention realizes the foregoing object by annealing through use of a first plasma annealing method employing a nitrogen containing plasma annealing atmosphere a silicon layer to form a silicon nitride containing layer upon a partially consumed silicon layer derived from the silicon layer. The silicon nitride containing layer is then thermally oxidized through use of a second thermal annealing method employing an oxidizing material containing annealing atmosphere to form a thermally oxidized silicon nitride containing layer which serves as the dielectric layer upon a further consumed silicon layer derived from the partially consumed silicon layer.

Although the method of the present invention is most likely to provide value in forming dielectric layers which may be employed as gate dielectric layers within field effect transistors (FETs) within integrated circuit microelectronics fabrications, the method of the present invention may also be employed when forming dielectric layers including but not limited to capacitive dielectric layers and gate dielectric layers within microelectronics fabrications including but not limited to integrated circuit microelectronics fabrications, solar cell microelectronics fabrications, ceramic substrate microelectronics fabrications and flat panel display microelectronics fabrications.

First Embodiment

Figure 1:
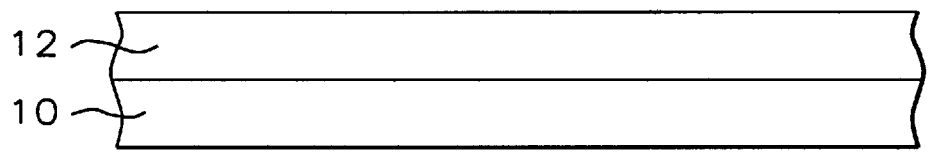
FIG. 1 to FIG. 4 show a series of schematic cross-sectional diagrams illustrating the results of forming in accord with a general embodiment of the present invention which comprises a first preferred embodiment of the present invention a dielectric layer upon a silicon layer within a microelectronics fabrication.

Referring now to FIG. 1 to FIG. 4, there is shown a series of schematic cross-sectional diagrams illustrating the results of forming within a microelectronics fabrication in accord with a general embodiment of the present invention which comprises a first preferred embodiment of the present invention a dielectric layer upon a silicon layer within the microelectronics fabrication. Shown in FIG. 1 is a schematic cross-sectional diagram of the microelectronics fabrication at an early stage in fabrication in accord with the method of the present invention.

Shown in FIG. 1 is a substrate 10 employed within a microelectronics fabrication, where the substrate 10 has a silicon layer 12 formed thereover. Within the first preferred embodiment of the present invention, the substrate 10 may be a substrate employed within a microelectronics fabrication selected from the group of microelectronics fabrications including but not limited to integrated circuit microelectronics fabrications, solar cell microelectronics fabrications, ceramic substrate microelectronics fabrications and flat panel display microelectronics fabrications.

Although not specifically illustrated within the schematic cross-sectional diagram of FIG. 1, the substrate 10 may be the substrate itself employed within the microelectronics fabrication, or the substrate 10 may be the substrate employed within the microelectronics fabrication, where the substrate has formed thereupon or thereover any of several additional microelectronics layers as are commonly employed within the microelectronics fabrication. Such additional layers may include, but are not limited to additional microelectronics conductor layers, additional microelectronics semiconductor layers or additional microelectronics dielectric layers as are commonly employed within the microelectronics fabrication.

Within the first preferred embodiment of the present invention with respect to the silicon layer 12, the silicon layer 12 may be formed employing any of several methods and materials through which silicon layers are conventionally formed within microelectronics fabrications. Such methods may include, but are not limited to chemical vapor deposition (CVD) methods, plasma enhanced chemical vapor deposition (PECVD) methods and physical vapor deposition (PVD) sputtering methods, employing suitable silicon source materials, through which may be formed silicon layers including but not limited to amorphous silicon layers, monocrystalline silicon layers and polycrystalline silicon layers. For the first preferred embodiment of the present invention, the silicon layer 12 is typically and preferably formed of a polycrystalline silicon material formed to a thickness of from about 1000 to about 2500 angstroms over the substrate 10.

Figure 2:
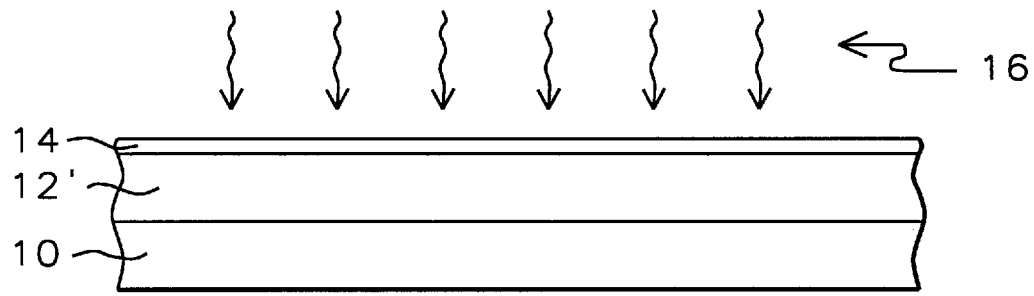

Referring now to FIG. 2, there is shown a schematic cross-sectional diagram illustrating the results of further processing of the microelectronics fabrication whose schematic cross-sectional diagram is illustrated in FIG. 1. Shown in FIG. 2 is a schematic cross-sectional diagram of a microelectronics fabrication otherwise equivalent to the microelectronics fabrication whose schematic cross-sectional is illustrated in FIG. 1, but wherein the silicon layer 12 has been partially consumed to form a partially consumed silicon layer 12' within a first plasma annealing method employing a nitrogen containing plasma annealing atmosphere 16 while simultaneously forming a silicon nitride containing layer 14 upon the partially consumed silicon layer 12'. Within the first preferred embodiment of the present invention, the nitrogen containing plasma annealing atmosphere 16 may be formed from a nitrogen containing reactant gas composition comprising a nitrogen containing reactant gas selected from the group including but not limited to nitrogen, nitrous oxide, nitric oxide and ammonia, along with non-reactive inert gas components such as but not limited to helium, neon and argon.

Within the first preferred embodiment of the present invention, the nitrogen containing plasma annealing atmosphere 16 is preferably employs either nitrogen, nitrous oxide, nitric oxide or ammonia alone employed at: (1) a reactor chamber pressure of from about 0.1 to about 10 torr; (2) a radio frequency power of from about 300 to about 750 watts at a radio frequency of 13.56 MHz; (3) a substrate 10 temperature of from about 200 to about 450 degrees centigrade; and (4) a nitrogen, nitrous oxide, nitric oxide or ammonia flow rate of from about 250 to about 750 standard cubic centimeters per minute (sccm).

Although not specifically illustrated within the schematic cross-sectional diagram of FIG. 1 and FIG. 2, the silicon layer 12 prior to annealing within the nitrogen containing plasma annealing atmosphere 16 is preferably free of an oxide layer, such as, and in particular, a native ambiently grown oxide layer, prior to forming the silicon nitride containing layer 14. Such oxide layers may be removed from the silicon layer 12 through etching within wet chemical etchants and dry plasma etchants as are common in the art of integrated circuit microelectronics fabrication.

Figure 3:
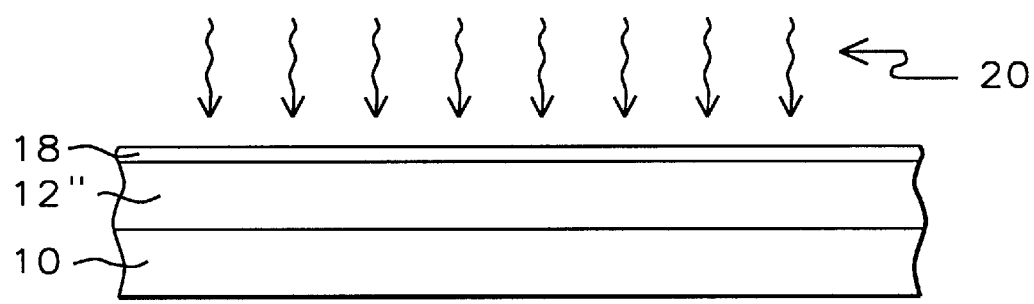

Referring now to FIG. 3, there is shown a schematic cross-sectional diagram illustrating the results of further processing of the microelectronics fabrication whose schematic cross-sectional diagram is illustrated in FIG. 2. Shown in FIG. 3 is a schematic cross-sectional diagram of a microelectronics fabrication otherwise equivalent to the microelectronics fabrication whose schematic cross-sectional diagram is illustrated in FIG. 2, but wherein the substrate 10 is exposed to a second thermal annealing method employing an oxidizing material containing annealing atmosphere 20 to form from the partially consumed silicon layer 12' a further consumed silicon layer 12" while simultaneously forming from the silicon nitride containing layer 14 a thermally oxidized silicon nitride containing layer 18.

Within the first preferred embodiment of the present invention, the oxidizing material containing annealing atmosphere 20 employs an oxidizing material selected from the group of oxidizing materials including but not limited to oxygen, ozone, nitrous oxide, nitric oxide and mixtures thereof, along with optional additional non-reactive diluent gases, such as but not limited to helium, neon and argon. More preferably, the oxidizing material containing annealing atmosphere 20 employs oxygen alone. More preferably, the second thermal annealing method also employs: (1) a reactor chamber pressure of from about 1 to about 3 torr; (2) a substrate 10 temperature of from about 350 to about 450 degrees centigrade; and (3) an oxygen flow rate of from about 500 to about 600 standard cubic centimeters per minute (sccm).

As is understood by a person skilled in the art, when employing within the second thermal annealing method within the first preferred embodiment of the present invention an oxidizing material which is an admixture of: (1) an oxygen or ozone oxidizing material; with (2) a nitrogen or nitrogen and oxygen containing oxidizing material, such as but not limited to nitrogen, nitrous oxide or nitric oxide, there is effected a process control within the first preferred embodiment of the present invention with respect to: (1) a nitrogen concentration within the thermally oxidized silicon nitride containing layer 18; and (2) a peak nitrogen concentration of the nitrogen concentration within the thermally oxidized silicon nitride containing layer 18.

Within the first preferred embodiment of the present invention when employing an oxygen oxidizing material containing annealing atmosphere 20, the thermally oxidized silicon nitride containing layer 18 is typically manifested substantially as a silicon nitride containing layer formed over a silicon oxide layer formed upon the further consumed silicon layer 12", since the oxygen oxidizing material containing annealing atmosphere 20 within the second thermal annealing method will typically diffuse more rapidly through the silicon nitride containing layer 14 than will silicon from the partially consumed silicon layer 12' diffuse through the silicon nitride containing layer 14.

Figure 4:
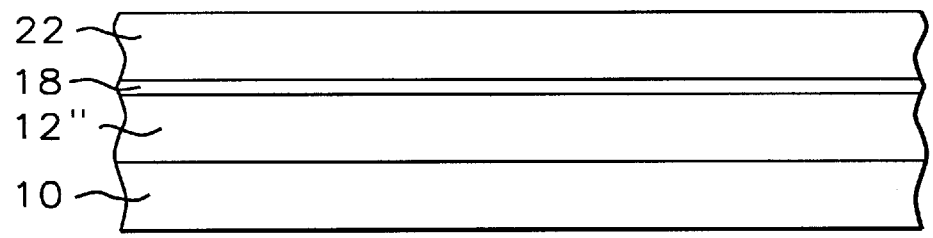

Referring now to FIG. 4, there is shown a schematic cross-sectional diagram illustrating the results of further processing of the microelectronics fabrication whose schematic cross-sectional diagram is illustrated in FIG. 3. Shown in FIG. 4 is a schematic cross-sectional diagram of a microelectronics fabrication otherwise equivalent to the microelectronics fabrication whose schematic cross-sectional diagram is illustrated in FIG. 3, but wherein there is formed upon the thermally oxidized silicon nitride containing layer 18 a second silicon layer 22. Within the first preferred embodiment of the present invention, the second silicon layer 22 may be formed through methods and materials analogous or equivalent to the methods and materials through which is formed the silicon layer 12.

Upon forming the microelectronics fabrication whose schematic cross-sectional diagram is illustrated in FIG. 4, and possibly also with further patterning of the second silicon layer 22, the thermally oxidized silicon nitride containing layer 18 and the further consumed silicon layer 12", there is formed within the microelectronics fabrication whose schematic cross-sectional diagram is illustrated in FIG. 4 a polysilicon capacitor formed from the further consumed silicon layer 12", the thermally oxidized silicon nitride containing layer 18 and the second silicon layer 22. The polysilicon capacitor so formed has enhanced dopant diffusion barrier properties due to the composition of the thermally oxidized silicon nitride containing layer 18.

Second Embodiment

Figure 5:
FIG. 5 to FIG. 8 show a series of schematic cross-sectional diagrams illustrating the results of forming in accord with a more specific embodiment of the present invention which comprises a second preferred embodiment of the present invention a gate dielectric layer within a field effect transistor (FET) within an integrated circuit microelectronics fabrication.

Referring now to FIG. 5 to FIG. 8, there is shown a series of schematic cross-sectional diagrams illustrating the results of forming in accord with a more specific embodiment of the present invention which comprises a second preferred embodiment of the present invention a gate dielectric layer within a field effect transistor (FET) within an integrated circuit microelectronics fabrication. Shown in FIG. 5 is a schematic cross-sectional diagram of the integrated circuit microelectronics fabrication at an early stage in its fabrication in accord with the second preferred embodiment of the present invention.

Shown in FIG. 5 is a semiconductor substrate 30 upon and within whose surface is formed a pair of isolation regions 32a and 32b which define an active region of the semiconductor substrate 30. Although semiconductor substrates are available with either dopant polarity, several dopant concentrations and various crystallographic orientations, for the second preferred embodiment of the present invention the semiconductor substrate 30 is preferably a (100) silicon semiconductor substrate having an N- or P- doping.

Similarly, although it is also known in the art of integrated circuit microelectronics fabrication that isolation regions may be formed within and/or upon semiconductor substrates to define active regions of those semiconductor substrates through methods including but not limited to isolation region thermal growth methods and isolation region deposition/patterning methods, for the second preferred embodiment of the present invention, the isolation regions 32a and 32b are preferably formed within and upon the semiconductor substrate 30 to define an active region of the semiconductor substrate 30 through a shallow trench isolation (STI) method employing a composite plasma enhanced chemical vapor deposited (PECVD)/sub-atmospheric pressure thermal chemical vapor deposition (SACVD) trench fill dielectric material.

Figure 6:
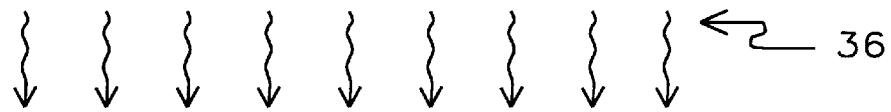
Figure 6:
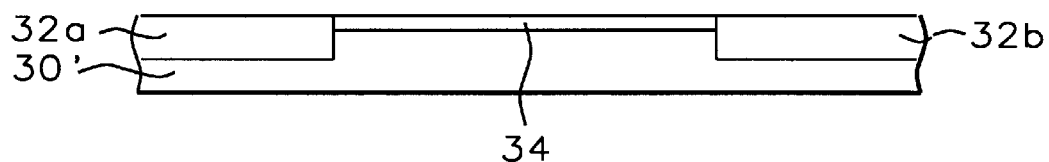

Referring now to FIG. 6, there is shown a schematic cross-sectional diagram illustrating the results of further processing of the integrated circuit microelectronics fabrication whose schematic cross-sectional diagram is illustrated in FIG. 5. Shown in FIG. 6 is a schematic cross-sectional diagram of an integrated circuit microelectronics fabrication otherwise equivalent to the integrated circuit microelectronics fabrication whose schematic cross-sectional diagram is illustrated in FIG. 5, but wherein there has been formed upon the active region of the semiconductor substrate 30 a silicon nitride containing layer 34 through thermal annealing of the semiconductor substrate 30 within a nitrogen containing annealing atmosphere 36 employed within a first thermal annealing method. Within the second preferred embodiment of the present invention, the first plasma annealing method and the nitrogen containing plasma annealing atmosphere 36 are preferably formed employing methods and materials analogous or equivalent to the methods and materials employed within the first plasma annealing method and nitrogen containing plasma annealing atmosphere 16 within the first preferred embodiment of the present invention as illustrated within the schematic cross-sectional diagram of FIG. 2.

Figure 7:
Figure 7:
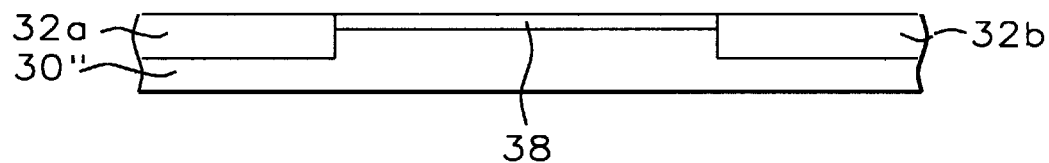

Referring now to FIG. 7, there is shown a schematic cross-sectional diagram illustrating the results of further processing of the integrated circuit microelectronics fabrication whose schematic cross-sectional diagram is illustrated in FIG. 6. Shown in FIG. 7 is a schematic cross-sectional diagram of an integrated circuit microelectronics fabrication otherwise equivalent to the integrated circuit microelectronics fabrication whose schematic cross-sectional diagram is illustrated in FIG. 6, but wherein the silicon nitride containing layer 34 has been thermally annealed within a second thermal annealing method employing an oxidizing material containing annealing atmosphere 40 to form a thermally oxidized silicon nitride containing layer 38 while simultaneously forming from the partially consumed semiconductor substrate 30' a further consumed semiconductor substrate 30".

Within the second preferred embodiment of the present invention, the oxidizing material containing annealing atmosphere 40 and the second thermal annealing method are preferably provided employing methods and materials analogous or equivalent to the methods and materials employed in providing the second thermal annealing method and the oxidizing material containing annealing atmosphere 20 within the first preferred embodiment of the present invention as illustrated within the schematic cross-sectional diagram of FIG. 3.

Figure 8:
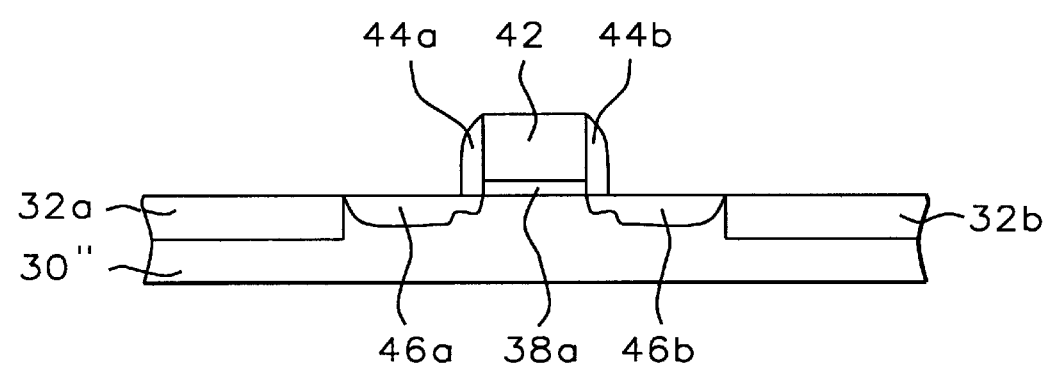

Referring now to FIG. 8, there is shown a schematic cross-sectional diagram illustrating the results of further processing of the integrated circuit microelectronics fabrication whose schematic cross-sectional diagram is illustrated in FIG. 7. Shown in FIG. 8 is a schematic cross-sectional diagram of an integrated circuit microelectronics fabrication otherwise equivalent to the integrated circuit microelectronics fabrication whose schematic cross-sectional diagram is illustrated in FIG. 7, but wherein: (1) the thermally oxidized silicon nitride containing layer 38 has been patterned to form a gate dielectric layer 38a within a field effect transistor (FET); (2) there is formed upon the gate dielectric layer 38a a gate electrode 42 employed within the field effect transistor (FET); (3) there is formed adjoining a pair of opposite edges of the gate electrode 42 and the gate dielectric layer 38a a pair of spacer layers 44a and 44b within the field effect transistor (FET); and (4) there is formed into the active region of the semiconductor substrate 30 at regions other than those occupied by the gate dielectric layer 38a and the gate electrode 42 a pair of source/drain regions 46a and 46b within the field effect transistor (FET). Each of the foregoing structures within the field effect transistor (FET) within the integrated circuit microelectronics fabrication whose schematic cross-sectional diagram is illustrated in FIG. 8 may be fabricated through methods as are conventional in the art of integrated circuit microelectronics fabrication.

For example, the gate dielectric layer 38a is typically and preferably formed from the thermally oxidized silicon nitride containing layer 38 through patterning, employing plasma etch methods employing fluorine containing etchant gas compositions as are conventional in the art of integrated circuit microelectronics fabrication, while employing the gate electrode 42 as an etch mask layer. Similarly, the gate electrode 42 is typically and preferably formed through patterning, through plasma etch methods as are conventional in the art of integrated circuit microelectronics fabrication, of a blanket layer of a gate electrode material. The blanket layer of the gate electrode material may be formed of a gate electrode material selected from the group of gate electrode materials including but not limited to metal, metal alloy, doped polysilicon and polycide (doped polysilicon/metal silicide stacks) gate electrode materials, although doped polysilicon and polycide gate electrode materials are most common in the art of integrated circuit microelectronics fabrication. Further, the spacer layers 44a and 44b are, as is conventional in the art of integrated circuit microelectronics fabrication, preferably formed employing anisotropic etch methods while employing a blanket dielectric layer formed from a dielectric material selected from the group of dielectric materials including but not limited to silicon oxide dielectric materials, silicon nitride dielectric materials and silicon oxynitride dielectric materials. Finally, the source/drain regions 46a and 46b are preferably formed through ion implant methods, as are conventional in the art of integrated circuit microelectronics fabrication.

Upon forming the integrated circuit microelectronics fabrication whose schematic cross-sectional diagram is illustrated in FIG. 8, there is formed an integrated circuit microelectronics fabrication having formed therein a field effect transistor (FET) in turn having formed therein a gate dielectric layer employing the method of the present invention. The field effect transistor (FET) so formed has enhanced hot carrier resistance properties and enhanced dopant diffusion barrier properties in comparison with field effect transistors (FETs) whose gate dielectric layers are not formed employing the method of the present invention. Similarly, the gate dielectric layer so formed is formed with an inhibited oxidation rate which provides a gate dielectric layer of greater uniformity.

As is understood by a person skilled in the art, the preferred embodiments and examples of the present invention are illustrative of the present invention rather than limiting of the present invention. Revisions and modifications may be made to methods, materials, structures and dimensions through which are fabricated microelectronics fabrications having formed therein dielectric layers formed in accord with the preferred embodiments and examples of the present invention while still providing microelectronics fabrications having formed therein dielectric layers in accord with the spirit and scope of the present invention, as defined by the accompanying claims.

What is claimed is:

1. A method for forming a dielectric layer upon a silicon layer comprising:

providing a substrate employed within a microelectronics fabrication;

forming over the substrate a silicon layer;

forming through use of a first plasma annealing method employing a nitrogen containing plasma annealing atmosphere a silicon nitride containing layer upon a partially consumed silicon layer derived from the silicon layer;

oxidizing through use of a second thermal annealing method employing an oxidizing material containing atmosphere the silicon nitride containing layer to form an oxidized silicon nitride containing layer upon a further consumed silicon layer derived from the partially consumed silicon layer.

2. The method of claim 1 wherein the microelectronics fabrication is selected from the group consisting of integrated circuit microelectronics fabrications, solar cell microelectronics fabrications, ceramic substrate microelectronics fabrications and flat panel display microelectronics fabrications.

3. The method of claim 1 wherein the silicon layer is formed from a silicon material selected from the group consisting of amorphous silicon materials, polycrystalline silicon materials and monocrystalline silicon materials.

4. The method of claim 1 wherein the nitrogen containing plasma annealing atmosphere employs a nitrogen containing plasma annealing gas selected from the group consisting of nitrogen, nitrous oxide, nitric oxide and ammonia.

5. The method of claim 1 wherein the oxidizing material is selected from the group consisting of oxygen, ozone, nitrous oxide and nitric oxide.

6. The method of claim 1 wherein the oxidizing material employs an oxygen and nitrogen containing oxidizing material which effects a process control with respect to:
- a nitrogen concentration within the thermally oxidized silicon nitride containing layer; and
- a peak nitrogen concentration of the nitrogen concentration within the thermally oxidized silicon nitride containing layer.

7. The method of claim 1 wherein the thermally oxidized silicon nitride containing layer is employed as a dielectric layer within a microelectronics device selected from the group consisting of a capacitor and a field effect transistor (FET).

8. A method for forming a gate dielectric layer for use within a field effect transistor (FET) comprising:
providing a silicon semiconductor substrate;
forming through use of a first plasma annealing method employing a nitrogen containing plasma annealing atmosphere a silicon nitride containing layer upon a partially consumed silicon semiconductor substrate derived from the silicon semiconductor substrate;
oxidizing through use of a second thermal annealing method employing an oxidizing material containing atmosphere the silicon nitride containing layer to form an oxidized silicon nitride containing layer upon a further consumed silicon semiconductor substrate derived from the partially consumed silicon semiconductor substrate.

9. The method of claim 8 wherein the nitrogen containing plasma annealing atmosphere employs a nitrogen containing plasma annealing gas selected from the group consisting of nitrogen, nitrous oxide, nitric oxide and ammonia.

10. The method of claim 8 wherein the oxidizing material is selected from the group consisting of oxygen, ozone, nitrous oxide and nitric oxide.

11. The method of claim 8 wherein the oxidizing material employs an oxygen and nitrogen containing oxidizing material which effects a process control with respect to:
- a nitrogen concentration within the thermally oxidized silicon nitride containing layer; and
- a peak nitrogen concentration of the nitrogen concentration within the thermally oxidized silicon nitride containing layer.

12. The method of claim 1, wherein said nitrogen containing plasma anneal step is conducted at from about 0.1 to 10 torr, a radio frequency power of from about 300 to 750 watts at a radio frequency of about 13.56 MHz, a substrate temperature of from about 200 to 450° C., a nitrogen containing gas flow rate of from about 250 to 750 sccm, and using a nitrogen containing gas selected from the group comprising nitrogen, nitrous oxide, nitric oxide, and ammonia; and wherein said oxidizing step is conducted at from about 1 to 3 torr, a substrate temperature of from about 350 to 450° C., and an oxygen flow rate of from about 500 to 600 sccm.

13. The method of claim 8, wherein said nitrogen containing plasma anneal step is conducted at from about 0.1 to 10 torr, a radio frequency power of from about 300 to 750 watts at a radio frequency of about 13.56 MHz, a substrate temperature of from about 200 to 450° C., a nitrogen containing gas flow rate of from about 250 to 750 sccm, and using a nitrogen containing gas selected from the group comprising nitrogen, nitrous oxide, nitric oxide, and ammonia; and wherein said oxidizing step is conducted at from about 1 to 3 torr, a substrate temperature of from about 350 to 450° C., and an oxygen flow rate of from about 500 to 600 sccm.

* * * * *